(12) United States Patent
Peter et al.

(10) Patent No.: US 11,397,210 B1
(45) Date of Patent: Jul. 26, 2022

(54) SYSTEM FOR HIGH DENSITY TESTING OF BATTERIES WITHIN AN ENVIRONMENTAL TEST CHAMBER

(71) Applicant: Associated Environmental Systems, Inc, Acton, MA (US)

(72) Inventors: Beran Peter, Wayland, MA (US); Brockton Kenyon, Harvard, MA (US)

(73) Assignee: Associated Environmental Systems, Inc., Acton, MA (US)

( * ) Notice: Subject to any disclaimer, the term of this patent is extended or adjusted under 35 U.S.C. 154(b) by 663 days.

(21) Appl. No.: 16/444,685

(22) Filed: Jun. 18, 2019

Related U.S. Application Data

(60) Provisional application No. 62/686,703, filed on Jun. 19, 2018.

(51) Int. Cl.
| | |
|---|---|
| *G01R 31/36* | (2020.01) |
| *H01M 10/44* | (2006.01) |
| *G01R 31/3835* | (2019.01) |
| *G01R 31/388* | (2019.01) |
| *H01M 10/42* | (2006.01) |

(52) U.S. Cl.
CPC ....... *G01R 31/3644* (2013.01); *G01R 31/388* (2019.01); *G01R 31/3835* (2019.01); *H01M 10/4285* (2013.01); *H01M 10/441* (2013.01)

(58) Field of Classification Search
CPC ............ G01R 31/3644; G01R 31/3835; G01R 31/388; H01M 10/4285; H01M 10/441
USPC ....................................................... 324/426
See application file for complete search history.

(56) References Cited

U.S. PATENT DOCUMENTS

| | | | |
|---|---|---|---|
| 6,586,941 B2 | 7/2003 | Bertness et al. | |
| 6,759,849 B2 | 7/2004 | Bertness et al. | |
| 6,990,422 B2 | 1/2006 | Laletin et al. | |
| 8,816,692 B2 * | 8/2014 | Tom ....................... | G01N 27/27 324/426 |
| 9,207,283 B2 | 12/2015 | Partee | |
| 2011/0232302 A1 | 9/2011 | Dallinger et al. | |
| 2011/0273180 A1 | 11/2011 | Park et al. | |
| 2011/0273181 A1 * | 11/2011 | Park ...................... | H02J 7/0048 324/429 |
| 2013/0034758 A1 | 2/2013 | Raedsch et al. | |
| 2016/0161558 A1 * | 6/2016 | Ricciuti ............... | G01R 31/327 324/424 |

FOREIGN PATENT DOCUMENTS

| | | |
|---|---|---|
| CN | 107329092 A | 11/2017 |
| DE | 102010031884 A1 | 1/2012 |
| DE | 102011003750 A1 | 8/2012 |
| GB | 2406656 A | 4/2005 |
| KR | 20170019224 A | 2/2017 |

* cited by examiner

*Primary Examiner* — Nathaniel R Pelton
(74) *Attorney, Agent, or Firm* — Clocktower Law LLC; Erik J. Heels; Michael A. Bartley

(57) ABSTRACT

The All Test Platform (ATP) provides provides a safe and easy way to test batteries within an environmental test chamber. The ATP enables rapid changing of batteries and battery types between tests, and provides the highest density per square foot of environmental test chamber space available for battery testing. The ATP combines multiple components critical for battery testing into a configurable, scalable, safe, and high density battery testing platform.

1 Claim, 14 Drawing Sheets

SYSTEM FOR HIGH DENSITY TESTING OF BATTERIES WITHIN AN ENVIRONMENTAL TEST CHAMBER

CROSS-REFERENCE TO RELATED APPLICATIONS

This utility patent application claims priority from U.S. provisional patent application Ser. No. 62/686,703, filed Jun. 19, 2018, titled "System for High Density Testing of Batteries within an Environmental Test Chamber", naming inventors Beran Peter and Brockton Kenyon.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. Copyright 2019, Associated Environmental Systems.

BACKGROUND

Field of Technology

This disclosure relates to testing batteries, and more particularly to a fixture within an environmental chamber capable of supporting multiple batteries under test.

Background

Batteries, specifically those utilized in consumer electronics such as hand held electronics, smartphones and computers, need to be tested. More powerful batteries, such as those powering electric vehicles and appliances, face similar testing needs. Battery behavior such as durability, charge life, and physical expansion across a wide range of temperatures is critical for successful consumer electronic deployment. All batteries produced for a specific battery line, which may span multiple manufacturing lines, factories, and countries, must meet a minimum baseline performance. As performance of batteries is dependent on many variables during production, such as temperature when created, testing to ensure baseline performance is critical. There are also a number of very public issues (such as certain smartphone batteries catching fire or exploding) that drive a need for testing of batteries across a wide range of environmental conditions.

The quantity of batteries that need to be tested is very large. For example, approximately 380 million smartphones were sold in the first quarter of 2018, which leads to smart phone battery usage of over a billion a year. With a sample rate of 8% (which is common) of those batteries that go through extended testing over temperature ranges and extremes, that represents eighty million batteries that need to be tested per year. This provides a challenge as to how to best leverage a comprehensive testing environment over the largest quantity of batteries possible.

Additionally, companies who provide electronics that use batteries typically have multiple use cases, battery types, and sizes that also need to undergo environmental testing. Companies such as Samsung, Apple, Microsoft, and Google provide battery powered electronics in multiple formats, i.e. Smartphones, Tablets, Laptops etc. Tesla produces electric vehicle batteries at the Gigafactory. Each of these has a different size, format, and type of battery with the same testing requirements.

There are many existing environmental test chambers, as well as battery charging/discharging systems which can connect to the chamber to power and monitor battery tests. Cabling and connection is specific and dedicated to battery type, creating an intensive and time consuming process for swapping batteries being tested, and becomes even worse when swapping battery types.

Solutions available in the market are typically singular use and purpose built. A single shelf is placed in an environmental test chamber, battery connections are made (depending on the type of battery). Each battery connection is hard wired to a cable that is routed out a hole in the chamber to an external testing device that provides charging and discharging of the battery. Each of those cables might be tie wrapped together to try to make it a little neater. A lab technician will try to get as many batteries (perhaps 8 to 12) on the single shelf as possible.

After those batteries are tested, the technician then reaches into the chamber, removes the tested batteries, and replace them with a new set of batteries, likely having to disconnect and reconnect the interface to the external testing platform. Alternatively, the batteries are disconnected and the shelf is removed from the test chamber, new batteries are placed on the shelf and the shelf and batteries are re-installed in the chamber for the next test.

If a different type of battery is required for testing, the shelf itself, and the battery connection, would need to be replaced.

Time to set up a test per battery, time to test per battery, and reconfigurability of the test environment are all critical issues that affect battery testing throughput and have a significant effect on capital equipment costs and requirements needed to achieve battery testing quantities.

U.S. Patents

U.S. Pat. No. 9,207,283 ("UNIVERSAL BATTERY CHARGER AND METHOD OF USE THEREOF", inventor Partee, issued Dec. 8, 2018) discloses, in the Abstract, "A system and method for charging batteries. Stops are adjusted for each of the batteries to secure the number of batteries in place. The batteries are placed to abut the stops. Adjustable contacts of the battery charger are positioned against terminals of the batteries. The batteries are secured within the receptacles of the battery charger. The batteries are charged." Partee's charger may also be configured to test a number of batteries.

U.S. Pat. No. 8,816,692 ("TEST SYSTEM FOR A BATTERY MODULE", inventor Tom, issued Aug. 26, 2014) discloses, in the Abstract, "A test system for a battery module is provided. The system includes a housing having a bottom plate; and first, second, third and fourth side walls coupled to the bottom plate that defines an interior region. The system further includes a mounting fixture that fixedly holds the battery module thereon. The system further includes first, second, third and fourth coupling members. The system further includes a lid coupled to the housing utilizing the first, second, third and fourth coupling members. The system further includes a battery charging system that charges the battery module."

U.S. Patent Application Publications

United States Patent Application Publication No. 2011/0273181 ("BATTERY TESTING METHOD", inventors Park et al., published Nov. 10, 2011) discloses, in the Abstract, "The present invention allows batteries to be tested in conjunction with being re-charged, and identifies failed or failing batteries before they are put to further use. The present invention can simultaneously test and charge multiple batteries, and can simultaneously test and charge different types of batteries. A method according to various aspects of the present invention comprises: identifying, by a computer system comprising a user interface, a provided battery to be tested; receiving, through the user interface, a selection one or more tests to perform on the battery; and performing, using a battery testing system, the one or more tests on the battery. In this method, the battery testing system is in communication with the computer system, and the battery testing system comprises a battery interface for coupling with the battery."

What is needed is a platform that enables increased battery testing throughput and efficiency by delivering a high density (quantity) testing of batteries per sq ft. of testing volume, monitoring battery behavior during testing, enabling environmental condition testing, and also allowing for configurability for multiple types of batteries to be tested.

BRIEF SUMMARY

The All Test Platform (ATP) provides provides a safe and easy way to test batteries within an environmental test chamber. The ATP enables rapid changing of batteries and battery types between tests, and provides the highest density per square foot of environmental test chamber space available for battery testing. The ATP combines multiple components critical for battery testing into a configurable, scalable, safe, and high density battery testing platform.

The ATP allows for specific battery types to be easily inserted on sliding shelving that is interchangeable depending on the battery type and testing needs. These shelves allow an operator/test technician to slide the shelves out, change the batteries, slide back in, and begin testing without any requirement to disconnect and reconnect external devices and test equipment. Time savings and testing density are optimized in the platform.

To utilize the platform for a different battery type, a battery interface board is changed, the desired shelving is installed, and the platform is now available for high density testing of a different, unique battery type.

Features and Advantages

The ATP provides:

The ability to place a high quantity of batteries in the chamber, maximizing test density.

Interface via swappable circuit boards for connectivity to varying external testing devices.

Configurability via swappable and interchangeable circuit boards to test different types of batteries.

Slidable shelving systems that provides ease and safety of battery insertion into the test environment with no external disconnect required.

A modular system which is easy to use and configure based upon the user requirements.

BRIEF DESCRIPTION OF THE DRAWINGS

In the drawings, closely related figures and items have the same number but different alphabetic suffixes. Processes, states, statuses, and databases are named for their respective functions.

DETAILED DESCRIPTION, INCLUDING THE PREFERRED EMBODIMENT

In the following detailed description, reference is made to the accompanying drawings which form a part hereof, and in which are shown, by way of illustration, specific embodiments in which the invention may be practiced. It is to be understood that other embodiments may be used, and structural changes may be made without departing from the scope of the present disclosure.

Operation

Figure 1:
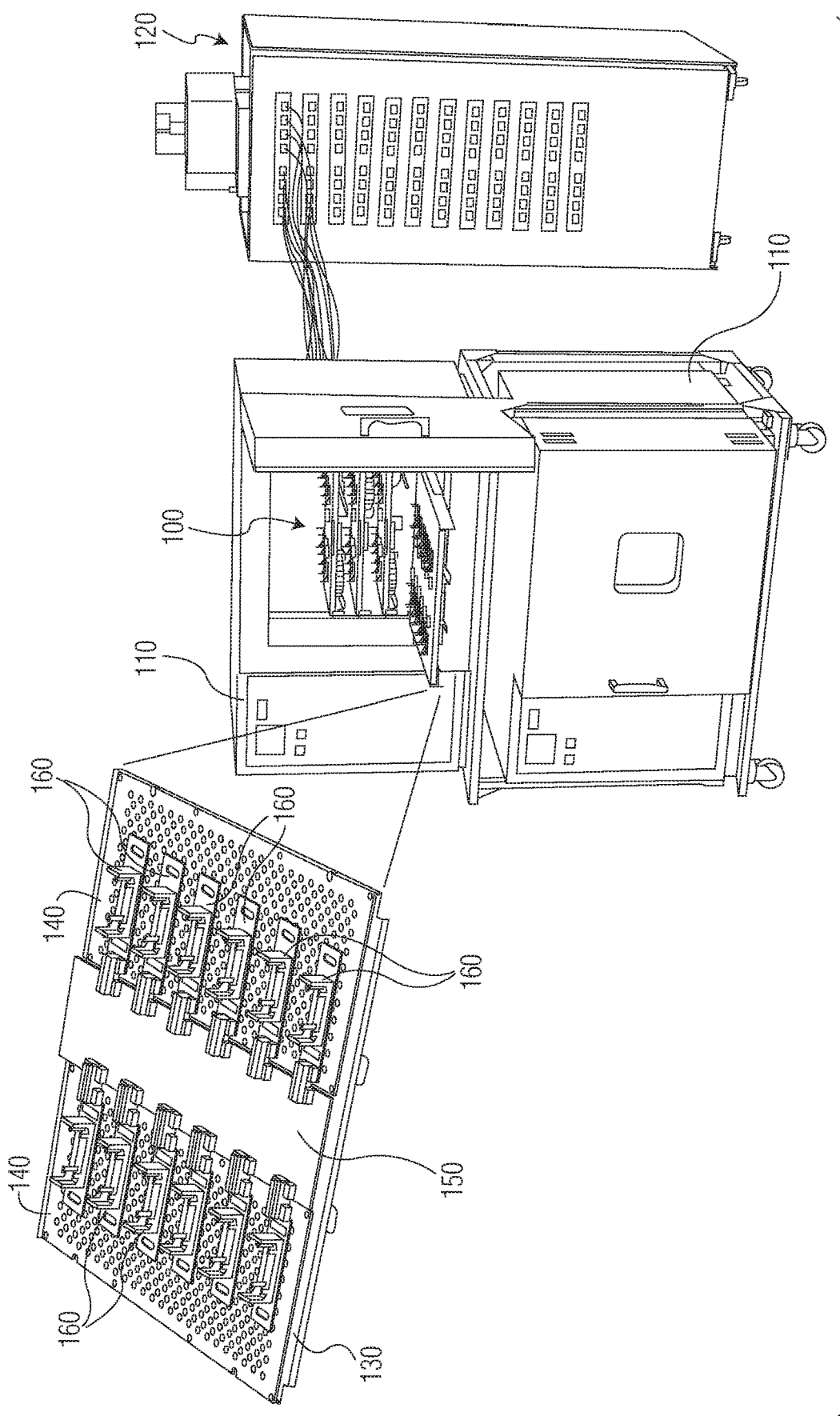
FIG. 1 shows two stacked environmental test chambers with All Test Platforms (ATPs) within, connected to an external battery powering and monitoring system. One environmental test chamber is closed, and the other is open with one carrier slid out and enlarged for a detailed view.

Referring to FIG. 1, the All Test Platform (ATP) 100 integrates a number of different components in a scalable and configurable manner to address the issues of the existing solutions in the marketplace. The ATP platform 100 holds and connects batteries, fits within an environmental test chamber 110, and routes wiring to an external system 120 powering and monitoring battery tests. MACCOR is on example manufacturer of such external systems, and also manufactures a temperature chamber. Associated Environmental Systems manufactures various environmental test chambers for temperature, humidity, corrosion, and other testing. The ATP is used within these chambers, or other test chambers from other manufacturers. Multiple test chambers 110 may be stacked or otherwise linked for larger scale testing.

Figure 2:
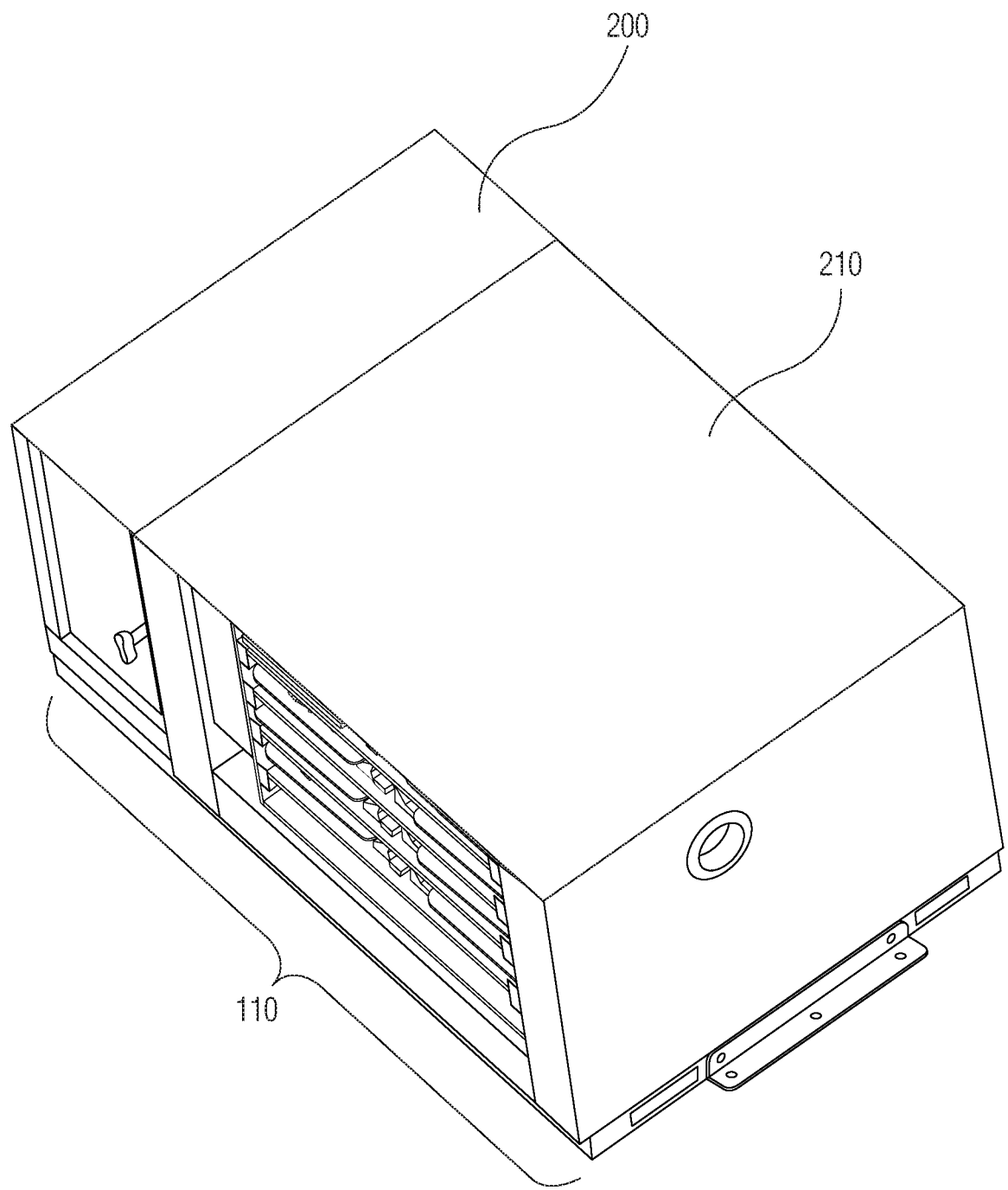
FIG. 2 shows an environmental test chamber with an ATP within.

Referring also to FIG. 2, environmental test chamber 110 typically contains a control section 200 for generating and controlling the conditions of the test, and a testing section 210 into which items to be tested are placed. The ATP platform fits into testing section 210. The figures illustrate testing section 120 as open on at least one side, which is done to illustrate the ATP components as in place within the text chamber. In operation, sides and covers may be attached to enclose testing section 210 and preserve the desired environmental testing conditions.

One example of battery testing in an environmental test chamber typically entails the chamber and batteries to be set at specific temperatures. For example, very cold to simulate cold weather device conditions. The longevity, performance and capacity of the battery are then tested by charging and discharging the battery in a test cycle.

Figure 3:
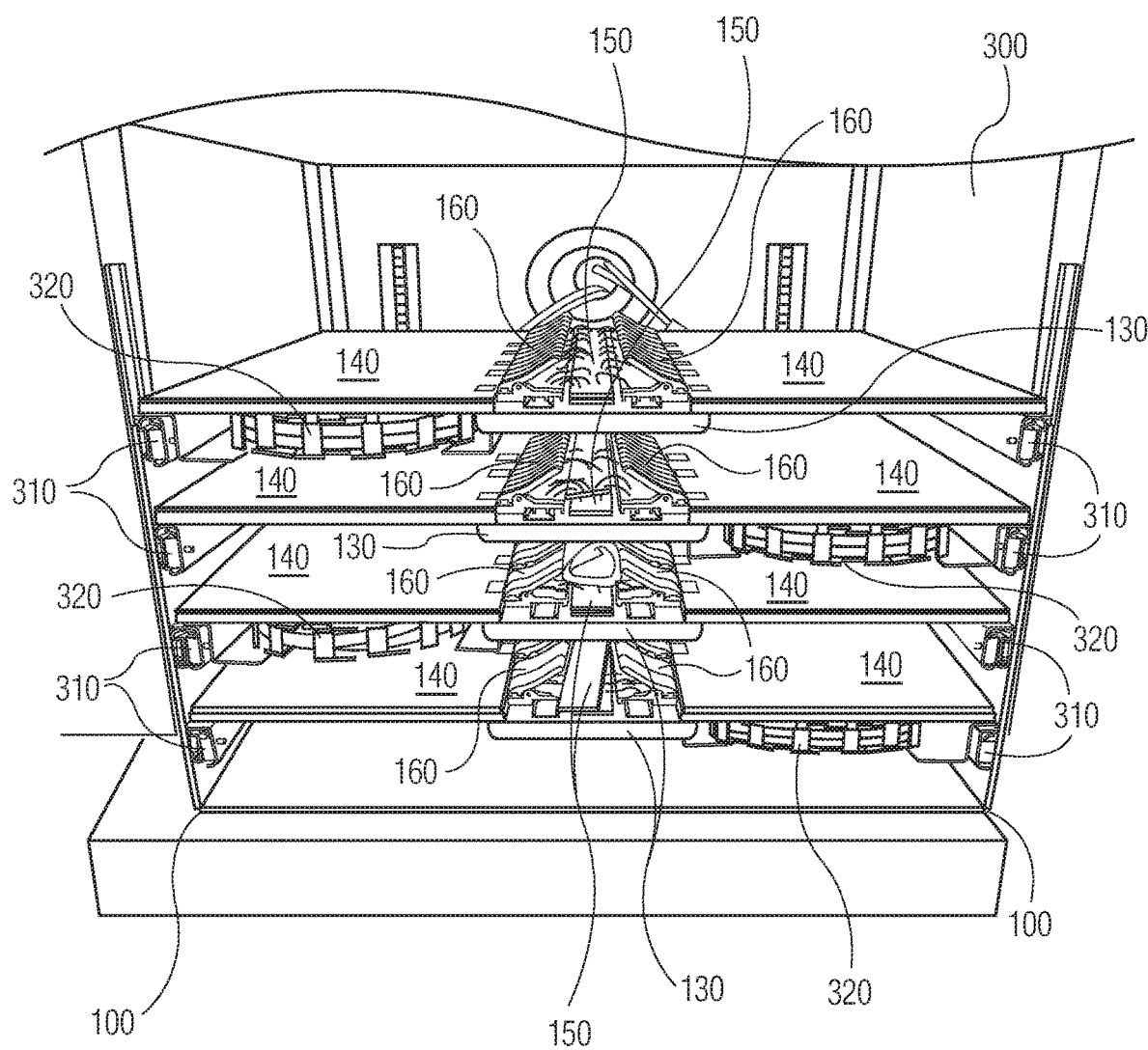
FIG. 3 shows an ATP within an environmental test chamber.

Referring also to FIG. 3, the parts of the ATP 100 include:
Frame 300
Rails 310
Carrier 130
Non-Conductive Shelf 140
Flexible cable carrier, with support and mounting 320
Battery Interface Board (ABIB) 150
Holders, clips, or connectors for Battery connection 160

Frame

Figure 4:
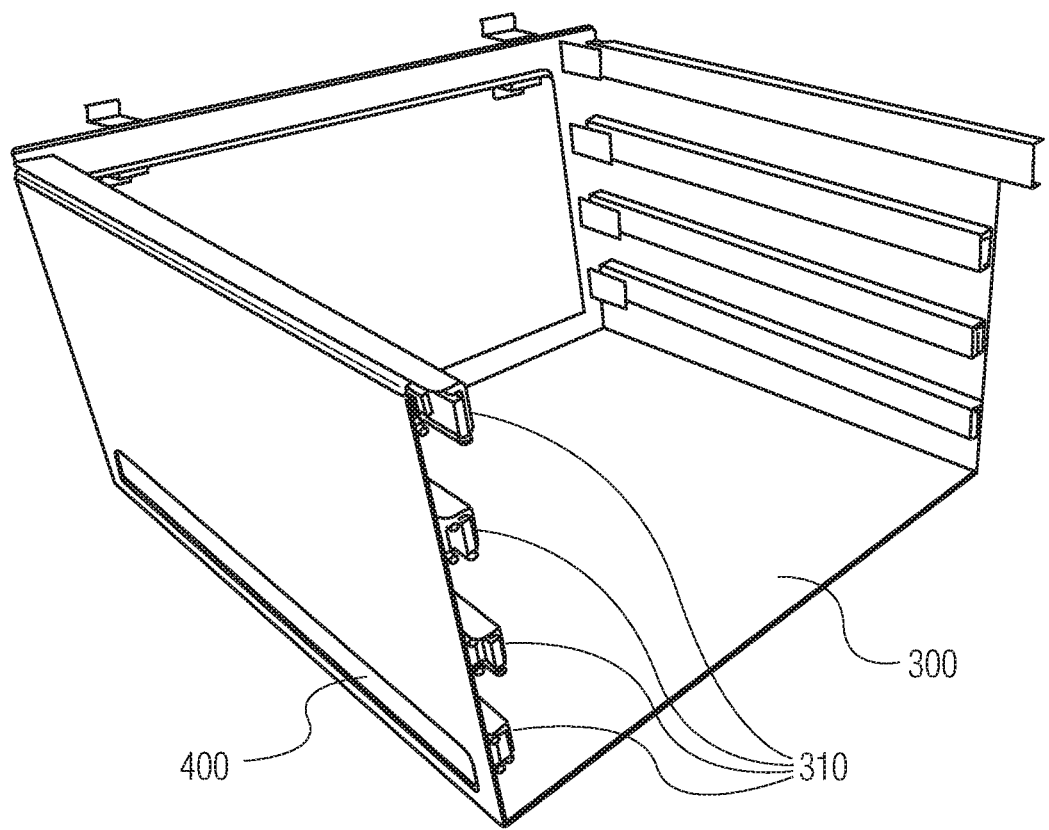
FIG. 4 shows a frame of an ATP.

Referring also to FIG. 4, frame 300 is constructed to fit inside an environmental test chamber, allowing for the addition of up to 4 carriers (sliding shelves) and related cabling harnesses. The frame includes bottom and side walls, a connection support on one end holding vertical position of the side walls, and an exposed end allowing sliding of the shelves. A side wall gap 400 may be included to improve integration and allow proper flow of environmental factors generated within the test chamber. Depending on the size of the chamber that it will be placed in to add high density battery testing capabilities, the dimensions of the frame then dictates the size of the carrier, how many shelves per carrier and how many carriers per frame. Smaller chambers might only have 3 carriers with a single shelf on each, allowing for maximum battery quantity of 24 batteries. This option may be chosen based on space constraints. For a less constrained physical environment, a frame that fits in a 8 CU FT internal chamber working volumes would support 4 carriers, 8 shelves and up to 64 batteries available for test. All frame material is made utilizing stainless steel, as the chamber testing environment can contain humidity and stainless steel construction eliminates the possibility of rust.

The Frame provides the structure for the shelving to be integrated, as well as the flexible cable carrier track for the electronic harness routing.

Rails

Rails 310 attached to the frame connect with rail attached under each carrier, creating slide-out access to shelves, ABIBs, and batteries.

Carrier

Figure 5:
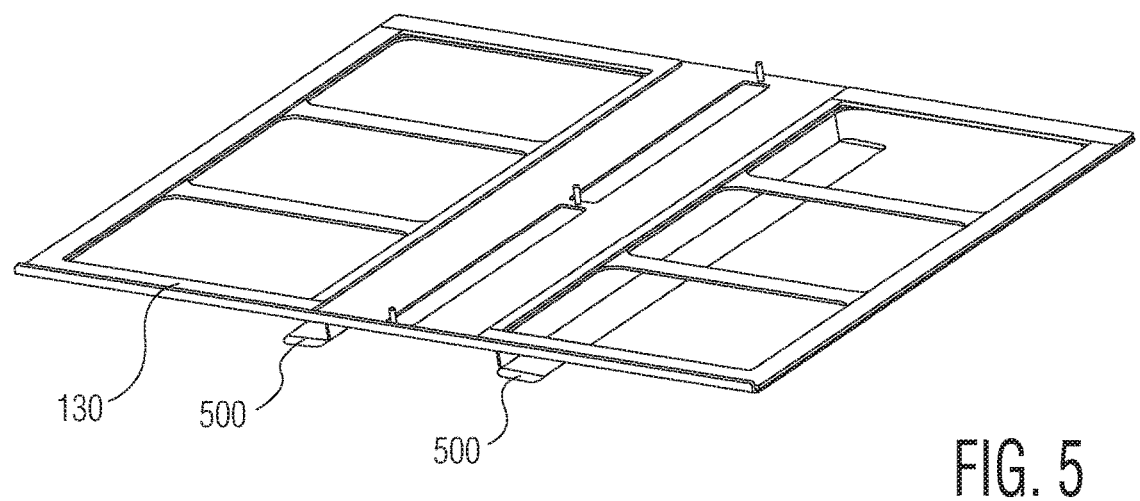
FIG. 5 shows a carrier of an ATP.

Referring also to FIG. 5, carrier 130 acts as a sliding shelf, able to slide in and out of the ATP on rails 310 connected to the frame. The carrier provides a mounting platform for two non-conductive shelves, and an ABIB between the non-conductive shelves. In the preferred configuration, the carrier is 19.118"×23" and made of stainless steel.

Non-Conductive Shelf

Figure 6:
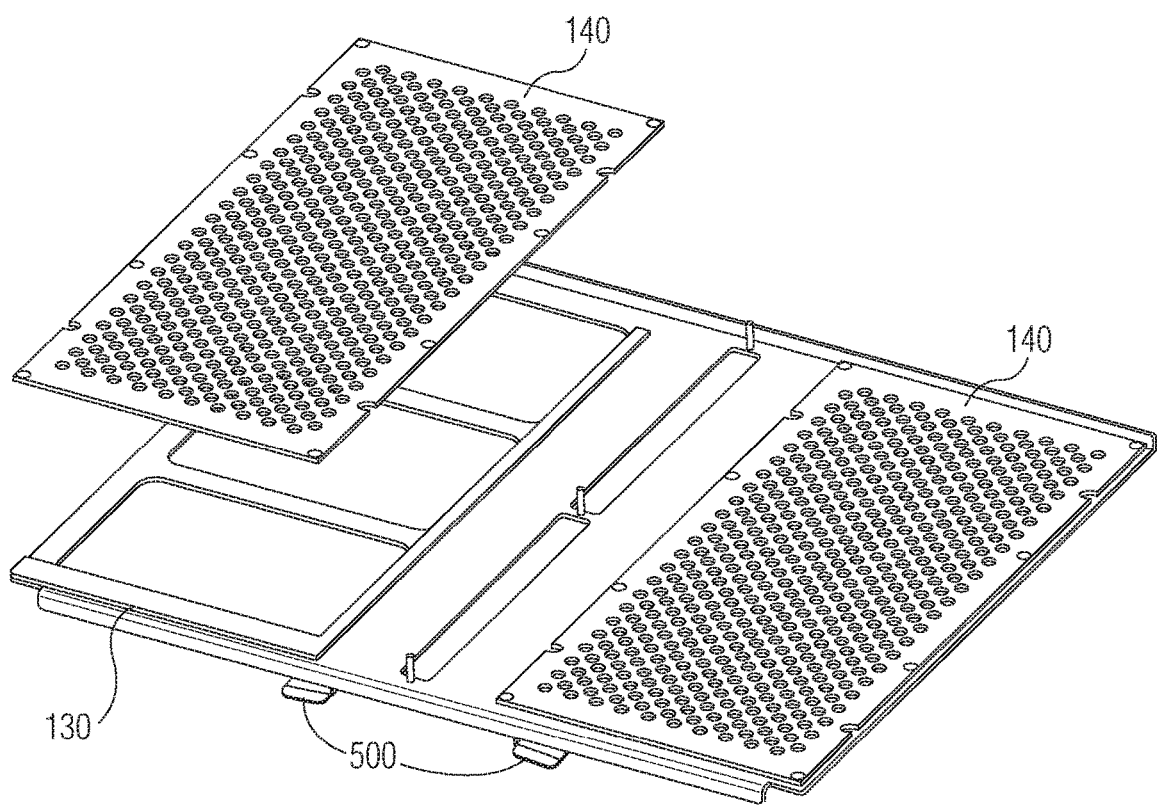
FIG. 6 shows a carrier with one shelf inserted and a second shelf being inserted.

Referring also to FIG. 6, each carrier 130 provides mounting for two non-conductive shelves 140. Each shelf integrates into the carrier, providing a surface for a device under test (DUT) to be placed on. This surface is designed to promote airflow, be non-conductive, and have a flatness specification. Depending on the configuration, the shelf can support different quantities and types of batteries.

In the preferred configuration, each shelf 140 is 19.055"× 8.858", and (depending on battery type) can support up to 8 batteries. With two shelves per carrier, and four carriers in the frame, the preferred embodiment supports up to 64 batteries being tested at the same time. To maximize testing efficiency, the shelving is also designed to maximize airflow in the chamber through four hundred and sixty 370 mm holes. This preferred hole sizing and alignment allows for sufficient airflow during testing while maintaining structural integrity, but can optionally be varied as long as sufficient airflow and structural integrity are maintained.

The preferred shelf is non conductive and light weight, made of FR4 glass epoxy, a substance commonly used in the manufacturing of circuit boards. In most testing application, this shelf will be used. Alternate shelves may be used interchangeably. In one alternative the shelf is made of aluminum and anodized to provide a non conductive surface. It is then milled and tested to very tight flatness tolerances. This shelf may be preferred for battery testing where the height of the battery is being monitored during temperature and charging cycles, dictating the need for a very flat surface. Batteries that are on the shelf may expand under certain electrical and/or temperature conditions. A tester may measure the vertical expansion (height) of the battery to insure it remains within the specifications it is designed for. The flatness of the alternate shelf is very important for this use case, as to not introduce fluctuations in the surface height that may affect the outcome of the test. In such a case, for example, the shelf needing a very tight flatness tolerance may be milled to have an overall flatness with a maximum deviation of 1 millimeter, and local flatness with a maximum deviation of 0.25 millimeter across any 100 square millimeter region within the surface. The specific flatness tolerance may vary based on the specific battery type and test requirement.

Flexible Cable Carrier, with Support and Mounting

Figure 7:
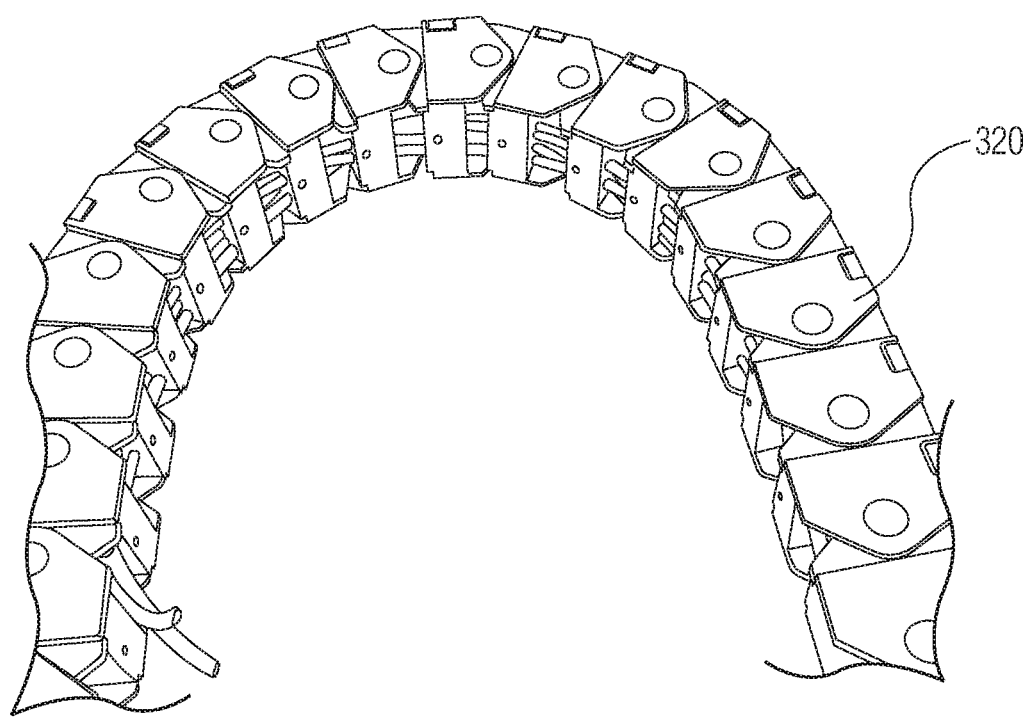
FIG. 7 shows a flexible cable carrier used within an ATP.
Figure 8:
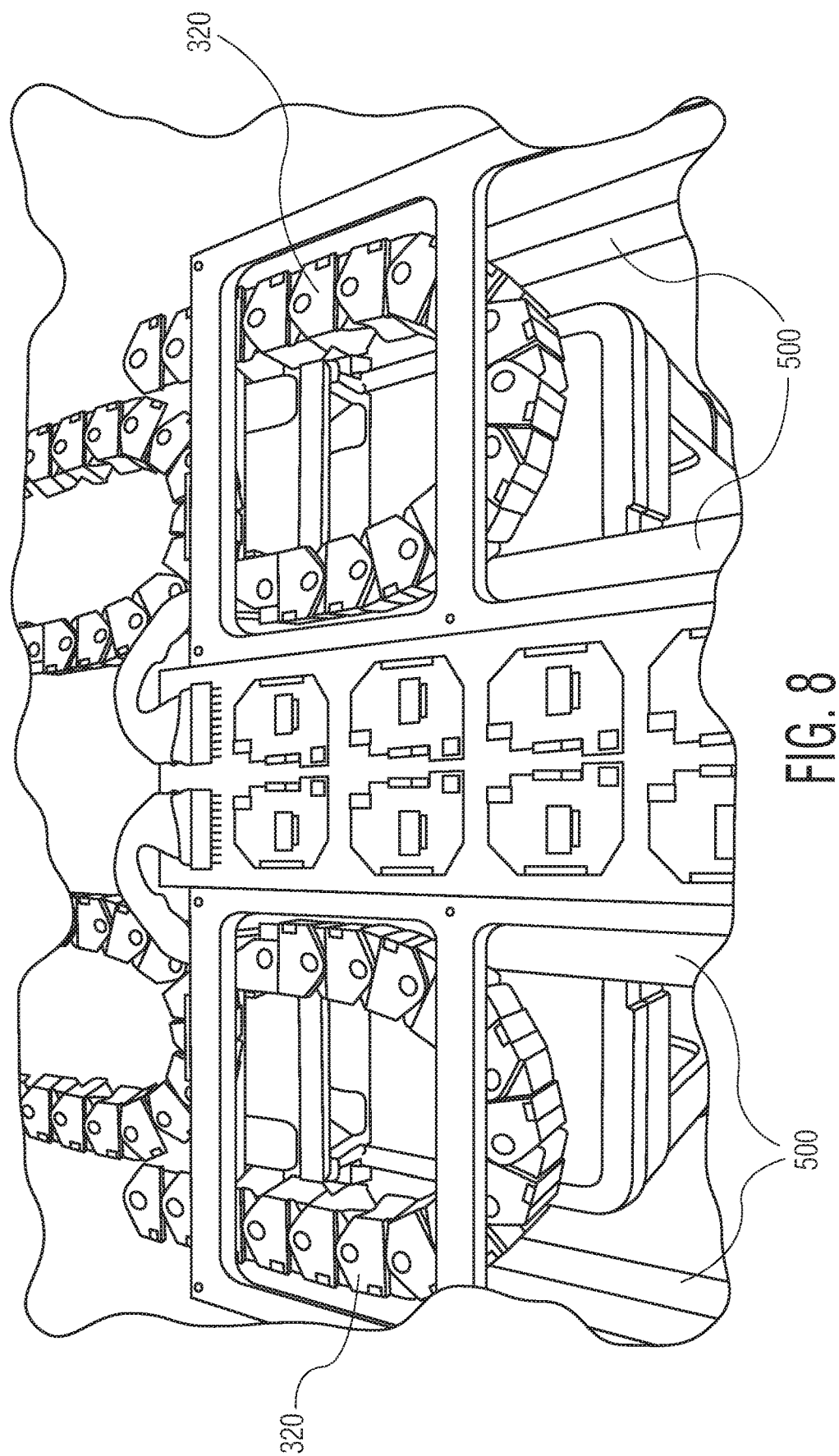
FIG. 8 shows a carrier without shelves slid out of an ATP, with flexible cable carrier visible beneath.
Figure 9:
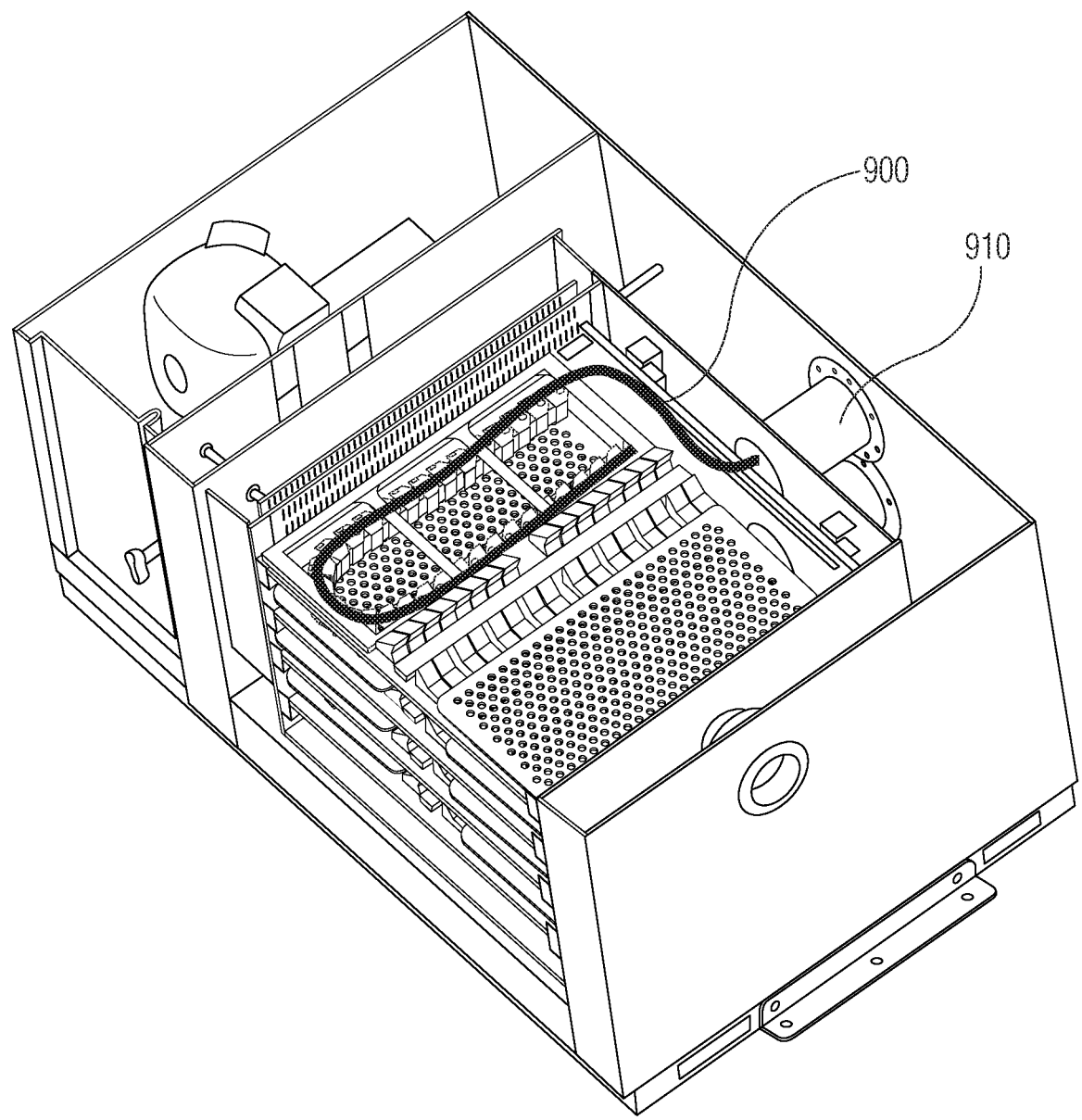
FIG. 9 shows a wiring path within an ATP for connecting with an external battery powering and monitoring system.

Referring also to FIGS. 7-9, connecting to the carrier 130 beneath each shelf 140, flexible cable carriers 320 guide wiring and allows each carrier to slide out on rails without requiring disconnection of any batteries or other wiring. Flexible cable carriers are preferably chained tracks, such as IGUS tracks, which support wiring or other cabling within. Flexible cable carrier tracks 320 may be guided on guide rails 500 connected to the underside of carrier 130 on each side of each shelf 140. As carrier 130 is slid in or out of frame 300, the flex portion of the cable carrier track adjusts and maintains the cable location, allowing wiring to remain connected. Wiring 900 guided and protected within the cable carrier track connects at one end to the ABIB, and the other end is guided out of the frame to exit through port 910 in the chamber and connects to the external system powering and monitoring the batteries.

While under test, each battery is charged and discharged. During these cycles the battery voltage is also read. This is accomplished with 4 physical connections made to each battery under test. There are Force+ and Force− connections as well as Sense+ and Sense−. The Force+/−lines provide the charge from the external device to the battery. Typical connections support up to 20 AMPs of current, but for different batteries and test requirements other connections supporting up to 100 AMPs or greater may be used. The Sense+/−line provide a Kelvin Connection circuit to read the voltage of the battery. This method of sensing is required so that there is no introduction of current into the equation, which would then introduce the resistance and voltage drops of the cabling system. Both of these pairs of wires must be routed to each battery. To support a battery testing maximum count per shelf of 8 batteries (16 per carrier) a cable harness of 16 pairs of cables per shelf is routed through the flexible cable carrier track. Positioned under each carrier and connected to the ABIB, the flexible cable carrier track routing allows each carrier to be pulled out on rails for easy access to the batteries under test.

Battery Interface Board (ABIB)

Figure 10:
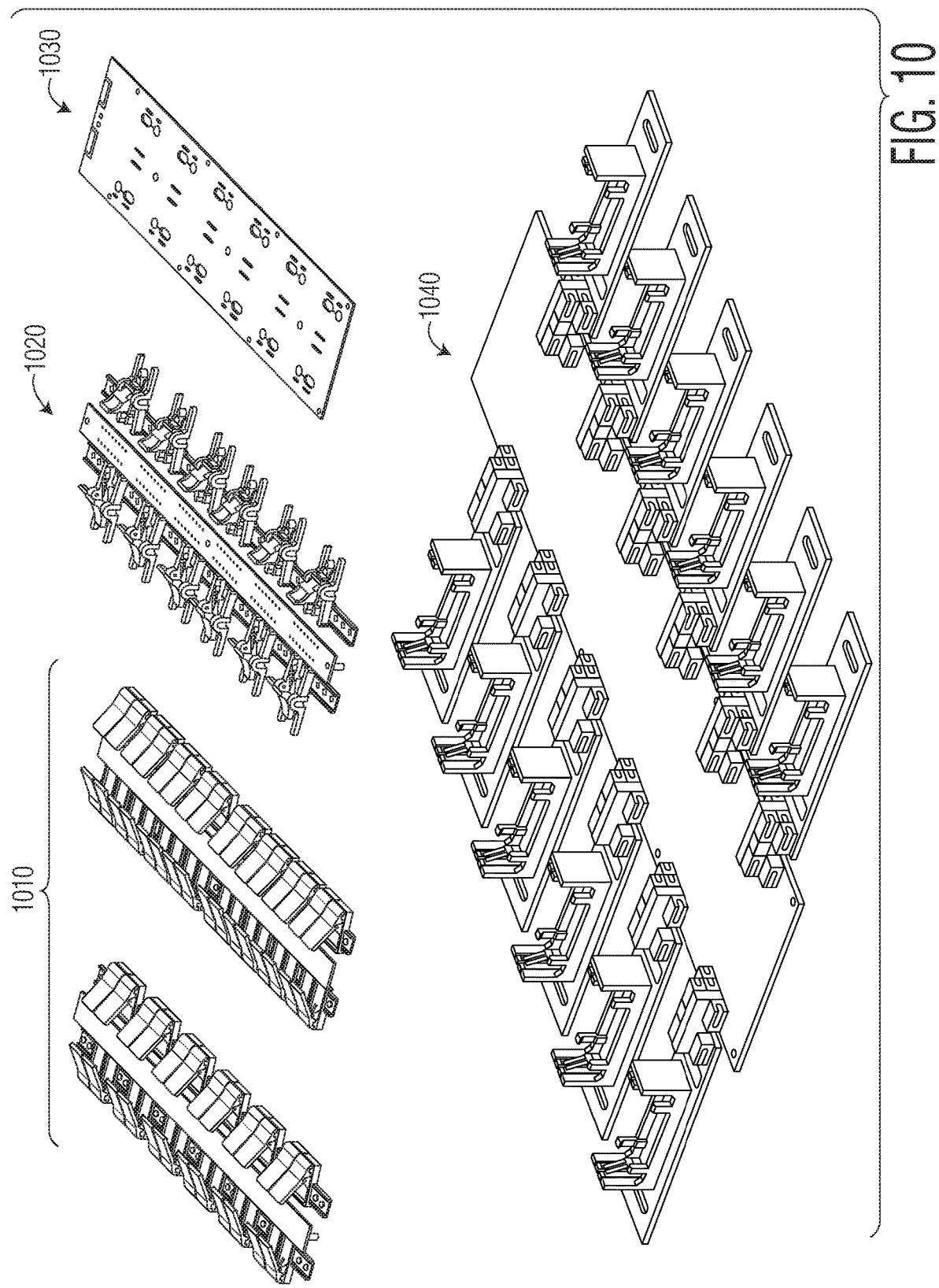
FIG. 10 shows different ABIBs.
Figure 11A:
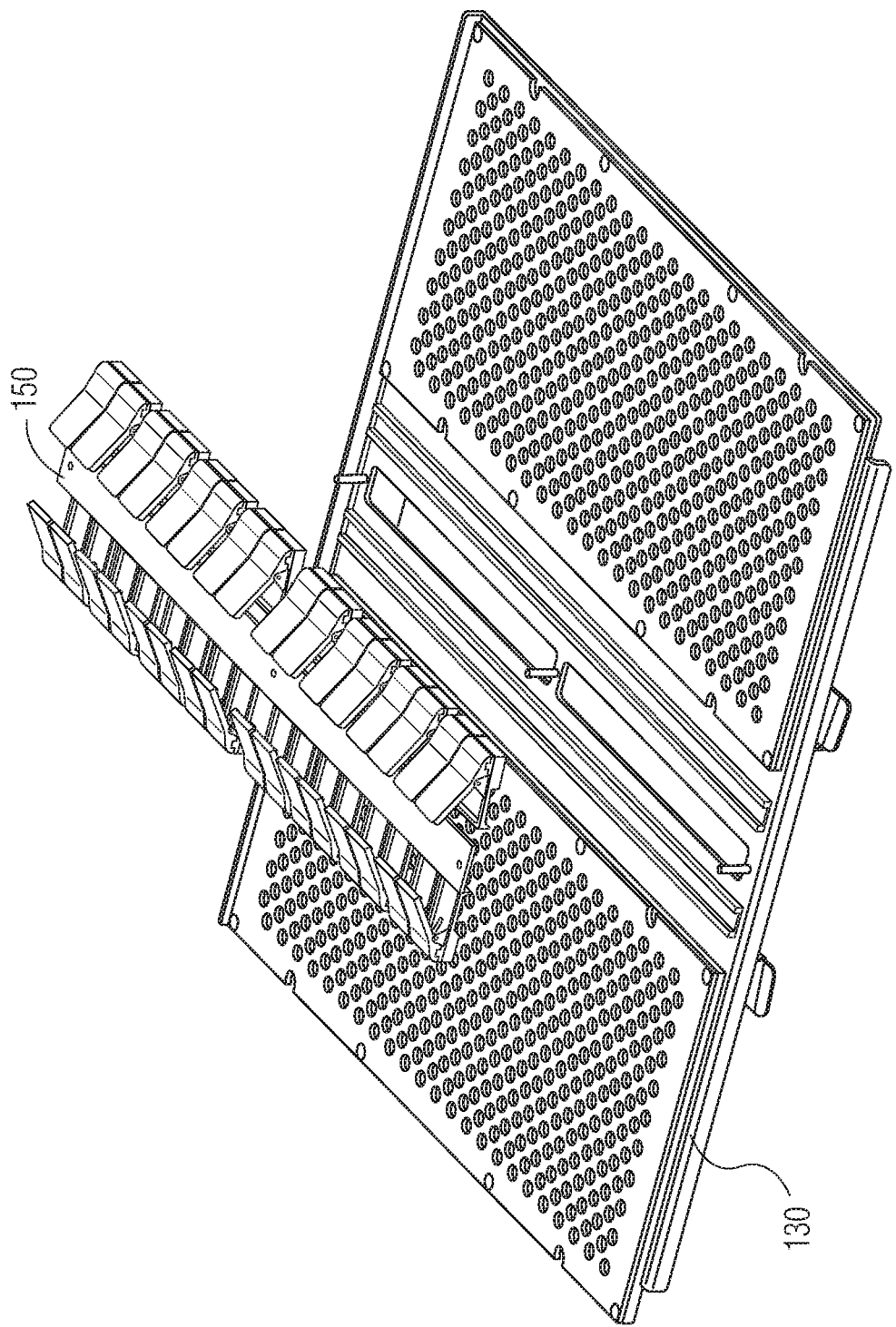
FIG. 11A shows a carrier with an ABIB about to be connected.
Figure 11B:
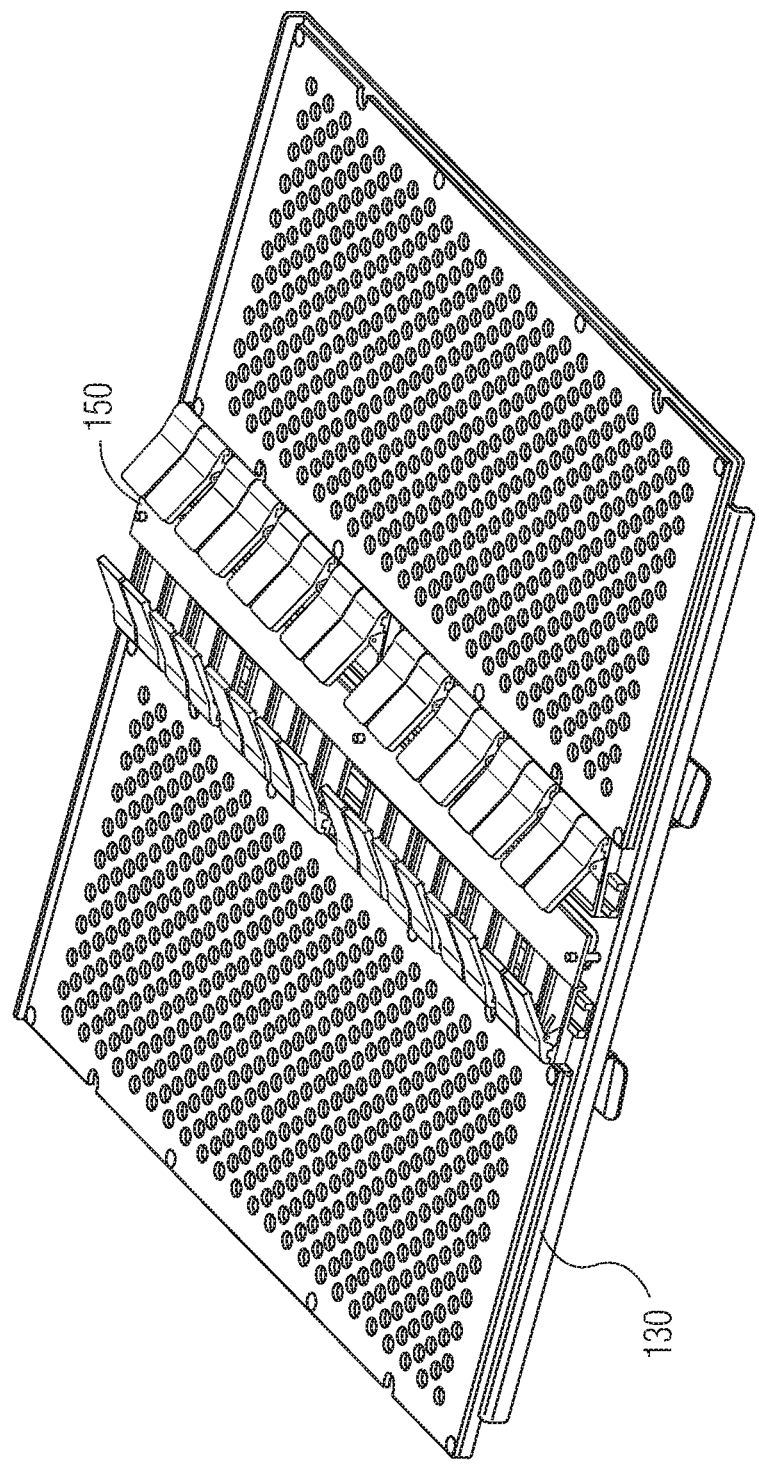
FIG. 11B shows the carrier with the ABIB connected.

Referring also to FIGS. 10, 11A, & 11B, ABIBs 150 connect into the center section of carrier 130. The ABIBs provide the ability to configure the ATP for testing different battery types simply by changing the AES battery interface board. The ABIBs provide the connectivity between the Battery and an external testing system. Different ABIBs are required for testing different battery types, adjusting for sensing, density, and connection requirements of various batteries.

To fit into the carrier, each ABIB is preferably sized at 19.188"×1.125". Each ABIB is a circuit board providing signaling and physical connection from/to the battery and the cable harness connecting to the external testing device. The interface cabling to the ABIB includes connectors, which allows easily the decoupling of the ABIB from the cabling harness. This makes the ABIBs easily swappable, allowing changing for different battery types without having to recable all the way through the system to the external device. The battery interface boards are interchangeable depending on battery type and much like the interchangeable shelving provide flexibility in the testing environment as well as future use. Holes in each ABIB may align with pins in the carrier to rapidly connect, orient, and position each ABIB between the adjacent shelves, although alternate connection mechanisms between ABIB and carrier may be used.

Figure 12:
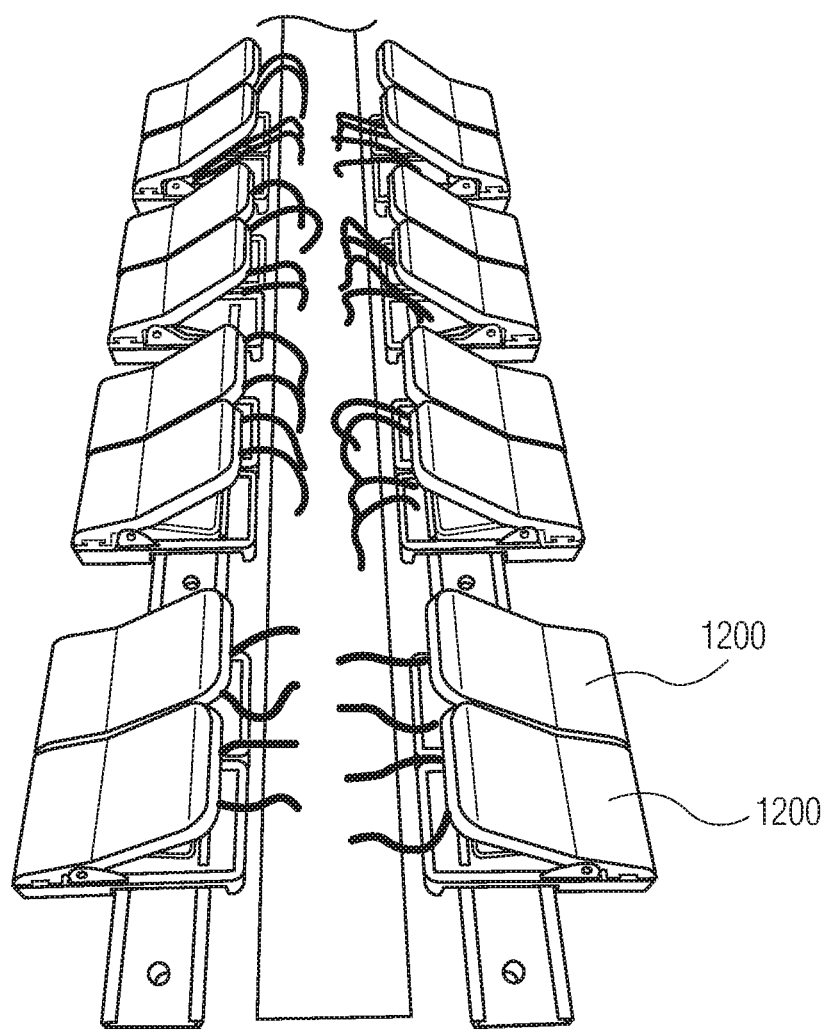
FIG. 12 shows an ATP-C ABIB with paired clips for connecting to battery leads.
Figure 13:
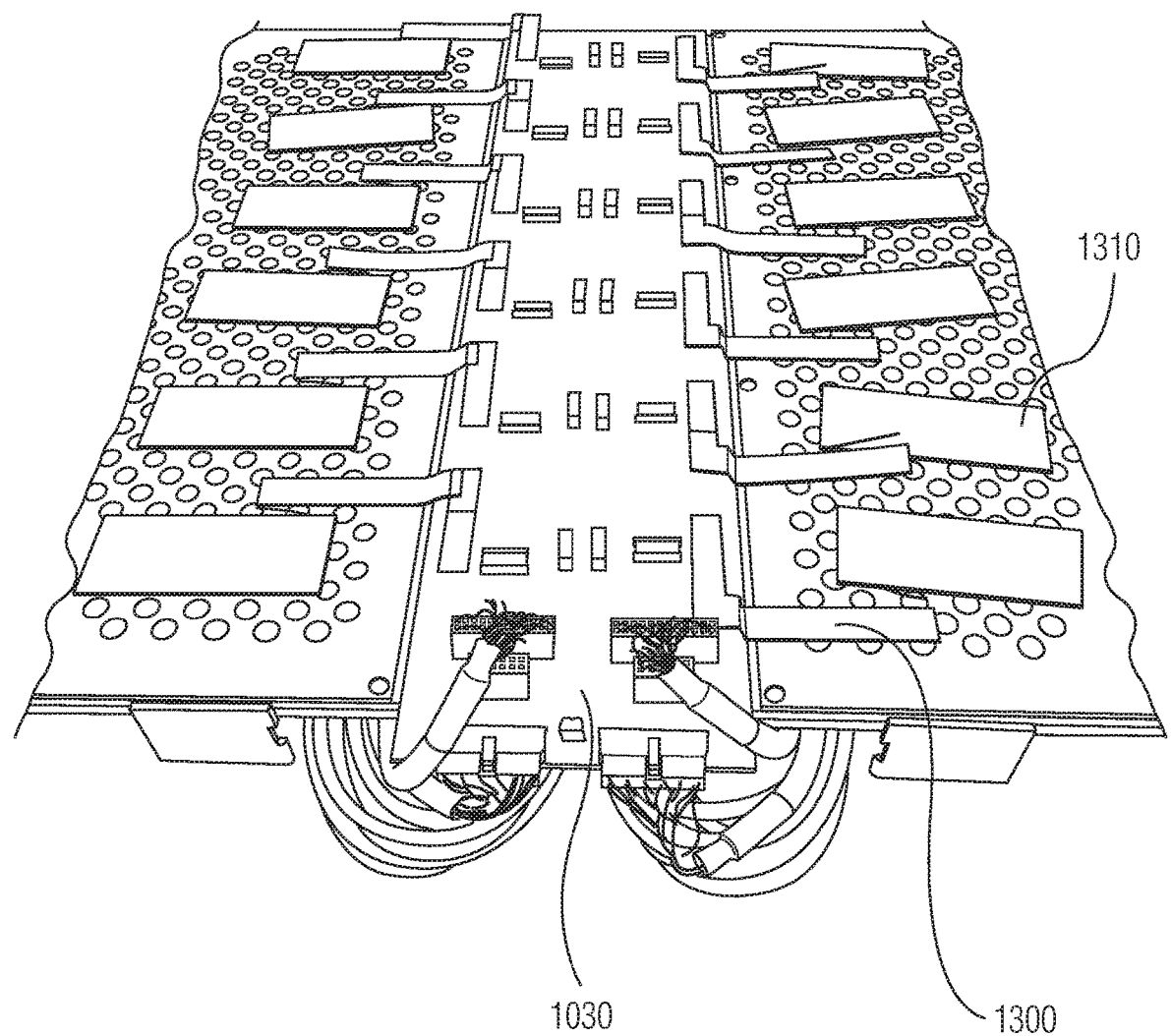
FIG. 13 shows an ATP-P ABIB connected to pack batteries on the non-conductive shelving, and cabling harnessed through the flexible cable carrier connected to the ABIB.
Figure 14:
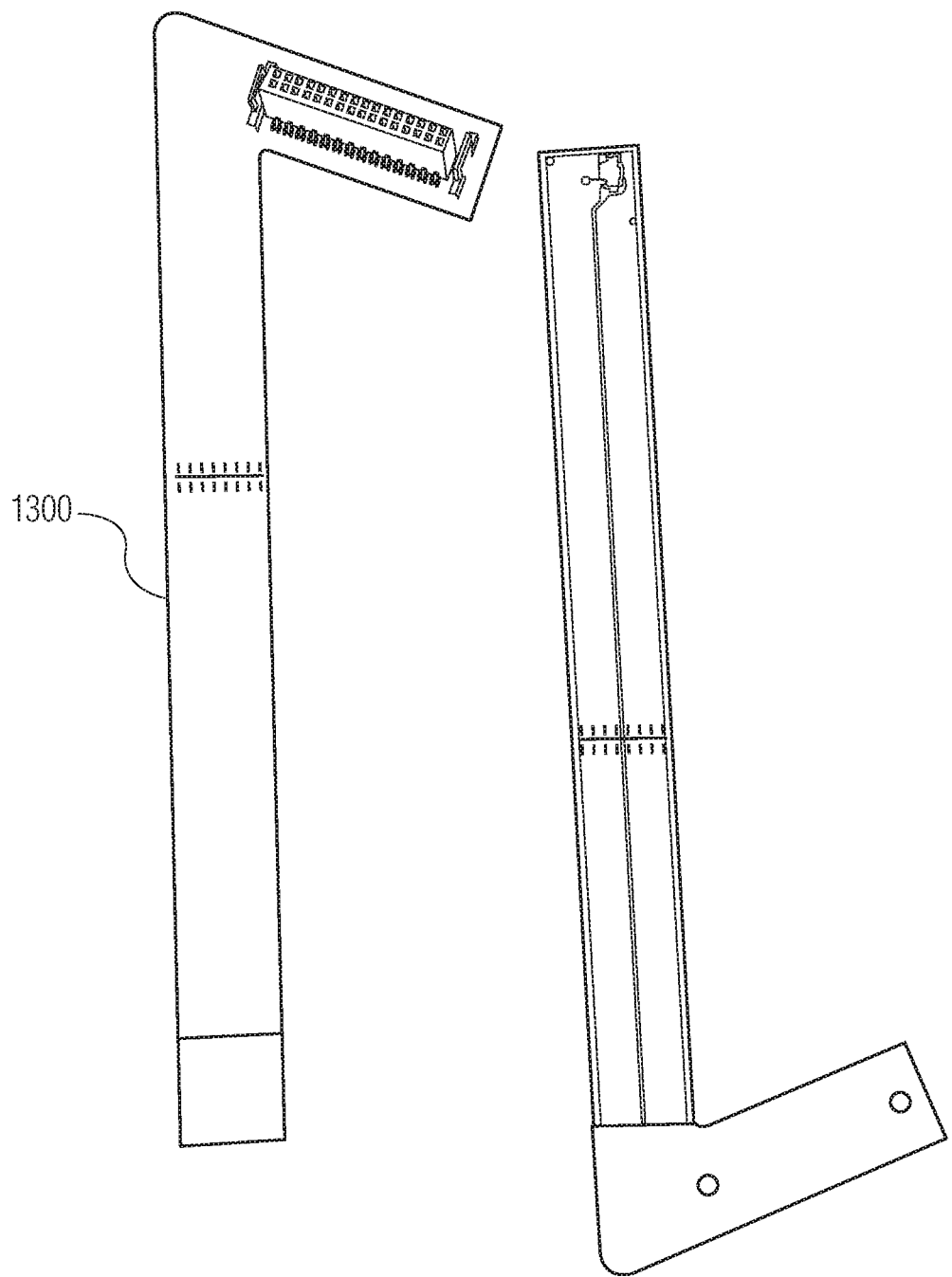
FIG. 14 shows a flex cable assembly used to connect batteries to an ATP-P ABIB.

ABIBs are available for cell batteries (ATP-C 1010), coin cell batteries (ATP-CC 1020), pack batteries (ATP-P 1030), and cylindrical cell batteries (ATP-BIB-P12 1040, which is configurable with different cell holders for AAA, AA, C, D, 18650, and 21700 batteries, which connect into the ABIB). Referring also to FIG. 12, ATP-C boards 1010 may utilize paired spring-loaded terminal clips 1200 to clamp to battery leads, and may be configured for testing different number of batteries (12 or 16 preferred). ATP-CC boards 1020 may directly connect to coin cell batteries. Referring also to FIG. 13, ATP-P boards 1030 may use a connector and flex cable 1300 to connect each battery 1310 to the ABIB. Referring also to FIG. 14, as pack batteries come in a variety of sizes, with different specific connectors and connector locations depending on the battery, flex cable 1300 may be sized and connector configured for the specific battery geometry and connection used.

OTHER EMBODIMENTS

If additional battery testing surface conditions are required by battery testers, a new shelf may be used and integrated into the carrier—allowing continued use and reuse of the testing environment as new testing requirements are defined.

For testing different battery types, new ABIBs may be implemented matching the connection requirements of the specific battery type and fitting the form factor for connection into the carrier.

As an alternative to use within an environmental test chamber, the ATP may be stood on its own, installed within a rack, or setup in a stacked arrangement of multiple ATPs, with each ATP connected to the external system which power cycles and monitors the batteries. Such configuration enables rapid testing of many batteries with ease through swapping batteries by sliding out shelves of the ATP and connecting/disconnecting batteries to the ABIBs. This may be preferred in scenarios that do not require testing under specific environmental conditions, such as verifying power status of an entire production run while placing a smaller selection through more stringent environmental condition tests.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A battery test platform system for insertion into an environmental test chamber and connection to an external system powering and monitoring batteries during test, the system comprising:
    a frame having two side walls, a bottom wall, and a side wall gap in one of the side walls allowing environmental conditions from the environmental test chamber to flow properly through the battery test platform system;
    eight frame rails attached to the side walls;
    four carriers, each carrier connecting to two frame rails to slide in and out of the frame;
    two non-conductive shelves inserted into each carrier, wherein each non-conductive shelf:
        is made of FR4 glass epoxy;
        contains four hundred and sixty holes, each hole having a diameter of three hundred and seventy millimeters; and
        has a very tight flatness tolerance;
    sixteen flexible cable carriers, positioned with one flexible cable carrier under each shelf, wherein each flexible cable carrier is a chained track such that a flex region of the chained track changes as the carrier is slid in or out of the frame, maintaining wiring positions of any wiring guided through the track;
    four battery interface boards (ABIBs) inserted one per carrier between the two non-conductive shelves in each carrier; and
    wiring guided through each of the flexible cable carriers such that each flexible cable carrier guides a wiring bundle connected from one end of the ABIB on the carrier above the flexible cable carrier to exiting the battery test platform system, wherein the wiring bundle includes wiring for a Force+, a Force−, a Sense+, and a Sense− connection per battery being tested on the shelf above the flexible cable carrier;
    wherein each ABIB is swappable to change the type of battery being tested, and has connections to test up to sixteen batteries (eight per shelf), and includes one of the following: spring-loaded terminal clips for connection to cell batteries; coin cell connectors for connection to coin cell batteries; cylindrical cell battery holders with connectors for connection to AAA, AA, C, D, 18650, or 21700 batteries; and connectors for flex cable connectors to connect to pack batteries.

* * * * *